United States Patent [19]

Nakanishi et al.

[11] Patent Number: 5,539,232

[45] Date of Patent: Jul. 23, 1996

[54] MOS COMPOSITE TYPE SEMICONDUCTOR DEVICE

[75] Inventors: Hidetoshi Nakanishi, Kawasaki; Satoshi Yanagisawa, Tokyo, both of Japan

[73] Assignee: Kabushiki Kaisha Toshiba, Kawasaki, Japan

[21] Appl. No.: 453,823

[22] Filed: May 30, 1995

[30] Foreign Application Priority Data

May 31, 1994 [JP] Japan .................................. 6-119404

[51] Int. Cl.⁶ .......................... H01L 29/10; H01L 29/78; H01L 23/48
[52] U.S. Cl. .................... 257/341; 257/785; 257/151; 257/181; 257/178; 257/765; 257/727; 257/401
[58] Field of Search .......................... 257/785, 341–343, 257/327, 328, 329, 773, 765, 727, 150, 151, 177, 178, 180, 181, 574, 401, 378, 370

[56] References Cited

U.S. PATENT DOCUMENTS

| 5,324,971 | 6/1994 | Notley ............................... | 257/328 |
| 5,376,815 | 12/1994 | Yokota et al. ....................... | 257/341 |

FOREIGN PATENT DOCUMENTS

| 0433650 | 6/1991 | European Pat. Off. | ......... | H01L 23/48 |
| 2077332 | 10/1971 | France | .............................. | H01I 11/00 |
| 3538815 | 5/1986 | Germany | .............................. | 257/177 |
| 3723150 | 1/1988 | Germany | ..................... | H01L 29/743 |
| 59-115558 | 7/1984 | Japan | ..................................... | 257/181 |
| 3-109772 | 5/1991 | Japan | ..................................... | 257/177 |
| 3-218643 | 9/1991 | Japan . | | |
| 6-85268 | 3/1994 | Japan . | | |

*Primary Examiner*—Robert P. Limanek
*Assistant Examiner*—Alexander Oscar Williams
*Attorney, Agent, or Firm*—Finnegan, Henderson, Farabow, Garrett & Dunner

[57] ABSTRACT

A plurality of segments of small-sized IGBT devices are arranged concentrically in a plurality of rows in a pellet substrate. Each segment has an independent polysilicon gate electrode layer. A gate electrode terminal lead-out portion is provided at a central portion of the pellet substrate. A metal gate electrode layer electrically connects the polysilicon gate electrode layer of at least one of the segments of a unit, which unit is constituted by at least one of the segments arranged radially from the central portion of the pellet substrate towards a peripheral portion of the pellet substrate, to the gate electrode terminal lead-out portion. The metal gate electrode layer includes a trunk wiring portion extending radially from the gate electrode terminal lead-out portion, and a branch wiring portion extending from the trunk wiring portion in a circumferential direction of the pellet substrate and electrically connected to the polysilicon gate electrode layer of each segment. The polysilicon gate electrode layer is rectangular, and the branch wiring portion is connected to the polysilicon gate electrode layer along three peripheral sides of the polysilicon gate electrode layer. The pellet substrate is clamped under pressure between an emitter pressure-contact plate and a collector pressure-contact plate.

14 Claims, 10 Drawing Sheets

MOS COMPOSITE TYPE SEMICONDUCTOR DEVICE

BACKGROUND OF THE INVENTION

1. Field of the Invention

The present invention relates generally to a MOS composite type semiconductor device driven by a MOS transistor and more particularly to a power semiconductor device such as an insulated gate bipolar transistor (IGBT), a MOS controlled thyristor (MCT), a MOS advanced gate turn-off thyristor (MAGT), or a power MOSFET.

2. Description of the Related Art

AMOS composite type semiconductor device driven by a MOS transistor is used as a power semiconductor device, in order to gain a high drive power with a low control voltage. In addition, in order to gain a large current, a structure in which a plurality of segments are arranged to form a device is adopted. FIG. 1 shows a pressure-contact type IGBT as an example of this type of power semiconductor device. In a pellet substrate 110, a middle-sized or small-sized IGBT element is used as one segment, and a plurality of segments 120 are arranged to constitute an IGBT. This type of IGBT is disclosed in, for example, Jap. Pat. Appln. KOKAI Publication No. 3-218643 (corresponding to U.S. Pat. No. 5,376,815).

As is shown in FIG. 2, each segment 120 is provided with a polysilicon gate electrode layer 122 having a plurality of openings 121. The polysilicon gate electrode layer 122 provided independently for each segment 120 is extended to a central portion of the pellet substrate 110 and is electrically connected to a gate electrode lead-out portion 123 formed of, e.g. Al at the central portion of the substrate 110.

With reference to FIG. 3, the cross-sectional structure of the IGBT and a method for manufacturing the IGBT will now be described. FIG. 3 is a cross-sectional view taken along line 3—3 in FIG. 2 showing the segment 120. FIG. 3 shows the state in which the pellet substrate is interposed between an emitter pressure-contact plate put in pressure contact with an emitter electrode layer and a collector pressure-contact plate put in pressure contact with a collector electrode layer.

At first, impurity ions are injected in a bottom surface portion of an $N^-$ semiconductor substrate 131, thus forming a bottom-side P emitter layer 132, and impurity ions are selectively injected in a major surface portion of the $N^-$ semiconductor substrate, thus forming a $P^+$ region 133. Then, the surface of the substrate 131 is thermal-oxidized and an oxide film is formed. After a polysilicon layer is formed on the oxide film, a gate oxide film 134 and a polysilicon gate electrode layer 122 are formed by patterning. In this case, the polysilicon gate electrode layer 122 is divided into the respective segments 120 shown in FIG. 2. Each segment has a pattern with openings 121. Impurity ions are injected in the substrate 131 through the openings 121 and P base regions 135 are formed. After a mask (not shown) is formed on bottom portions of the openings 121, impurity ions are injected in the P base region 135. Thus, N emitter regions 136 are formed. An oxide film 137 is formed on the resultant structure and regions of the oxide film 137 among the gate electrode layers 122 are selectively removed. Thus, portions of the N emitter region 136 and the P base regions 135 ($P^+$ region 133) among the N emitter regions 136 are exposed. An emitter electrode layer 138 is formed on the oxide film 137 and is electrically connected to the N emitter region 136 and $P^+$ region 133. A gate electrode lead-out portion 123 is formed and is electrically connected to the polysilicon gate electrode layer 122. Furthermore, a collector electrode layer 139 is formed on the bottom-side emitter layer 132.

Subsequently, the characteristics of the IGBT are checked in units of segment 120. If there is a segment with defective characteristics, the segment is repaired so that it will not function (i.e. the segment with defective characteristics is separated from normal segments). Then, an annular emitter pressure-contact plate 141 is provided on the emitter electrode layer 138, and a collector pressure-contact plate 142 is provided on the collector electrode layer 139. The pellet substrate 110 is interposed between both pressure-contact plates 141 and 142 under pressure acting in directions P1 and P2.

A method of repairing the defective segment will now be described in detail with reference to FIG. 4. If there is a defective segment 120a, as indicated by X-mark 150, a narrow portion (indicated by o-mark 160) of the polysilicon gate electrode layer near the connection part of the segment 120a with the gate electrode lead-out portion 123 is cut off by means of dry etching, etc. Thus, the defective segment 120a is separated from the gate electrode lead-out portion 123 and is rendered non-conductive.

However, in order to cut off the defective segment by means of dry etching, it is necessary to perform etching by forming a mask pattern having a hole corresponding to the cut-off portion 160 of the defective segment 120a. Thus, a process of repair is time-consuming.

In the structure as shown in FIGS. 1 to 3, when the defective segment 120a is repaired, the entire segment 120a does not function although the defective portion (x-mark 150) is only a part of the segment 120a (for example, one cell). Since the area which one segment occupies in the pellet is relatively large, the current drive performance after the repair deteriorates greatly in the above repairing method. If there are two or more defective segments, the current drive performance further deteriorates. Thus, in order to gain a sufficiently high current drive performance, it is necessary to enlarge the area of the pellet in consideration of a decrease in current drive performance due to the defective segments.

SUMMARY OF THE INVENTION

A first object of the present invention is to provide a power semiconductor device capable of being easily repaired.

A second object of the invention is to provide a power semiconductor device capable of curbing a decrease in current drive performance after repair.

A third object of the invention is to provide a power semiconductor device capable of gaining a sufficiently high current drive performance after repair, without increasing the area of a pellet in consideration of a decrease in current drive performance due to a defective segment.

A fourth object of the invention is to provide a power semiconductor device capable of being repaired even if there are a plurality of defective segments, with a less decrease in current drive performance.

A fifth object of the invention is to power semiconductor device capable of identifying a defective segment exactly and easily, rendering the defective segment non-operable exactly, and enhancing the efficiency of repair.

A sixth object of the invention is to provide a power semiconductor device capable of increasing an integration density.

The first to fourth objects of the invention can be achieved by a power semiconductor device comprising: a pellet substrate; a plurality of segments each constituted by at least one MOS composite type semiconductor cell, the segments being arranged concentrically in a plurality of rows in the pellet substrate, each segment having an independent polysilicon gate electrode layer; a gate electrode terminal lead-out portion provided at a central portion of the pellet substrate; a metal gate electrode layer for electrically connecting the polysilicon gate electrode layer of at least one of the segments of a unit, which unit is constituted by at least one of the segments arranged radially from the central portion of the pellet substrate towards a peripheral portion of the pellet substrate, to the gate electrode terminal lead-out portion; and a pressure-contact plate for clamping the pellet substrate.

The first to sixth objects of the invention can be achieved by a power semiconductor device comprising: a pellet substrate; a plurality of segments each constituted by at least one MOS composite type semiconductor cell, the segments being arranged concentrically in a plurality of rows in the pellet substrate, each segment having an independent polysilicon gate electrode layer; a gate electrode terminal lead-out portion provided at a central portion of the pellet substrate; and a metal gate electrode layer for electrically connecting the polysilicon gate electrode layer of at least one of the segments of a unit, which unit is constituted by at least one of the segments arranged radially from the central portion of the pellet substrate towards a peripheral portion of the pellet substrate, to the gate electrode terminal lead-out portion, the metal gate electrode layer including a trunk wiring portion extending radially from the gate electrode terminal lead-out portion, and a branch wiring portion extending from the trunk wiring portion in a circumferential direction of the pellet substrate and electrically connected to the polysilicon gate electrode layer of each segment.

According to the above structure, a defective segment can be separated by dropping an etching liquid on the metal gate electrode layer. Thus, a mask pattern, which is required in dry etching, is not needed, and easy repair is achieved. Since one segment is small and a defective segment is separated in units of a small segment, a decrease in current drive performance after repair can be curbed. Thus, a sufficiently high current drive performance can be obtained without increasing the area of a pellet substrate in consideration of a decrease in current drive performance due to a defective segment. Since a defective segment is repaired in units of a small segment, a plurality of defective segments can be repaired with a less decrease in current drive performance. A defective segment can be identified easily and exactly since a characteristic check is first performed for each trunk wiring portion extending radially from the gate electrode lead-out portion and then performed for each branch wiring portion extending from the trunk wiring portion in a circumferential direction of the pellet substrate. The defective segment can surely be rendered non-operable by short-circuiting the gate of the cut-off cell and emitter. Therefore, the efficiency of repair can be enhanced. Furthermore, if the branch wiring portion is formed to surround three sides of the polysilicon gate electrode layer and not to surround the remaining one side thereof, the pitch between segments can be reduced, and the integration density can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

FIGS. 5 to 10 show a pressure-contact type IGBT, as an example of a power semiconductor device according to a first embodiment of the present invention.

Figure 1:
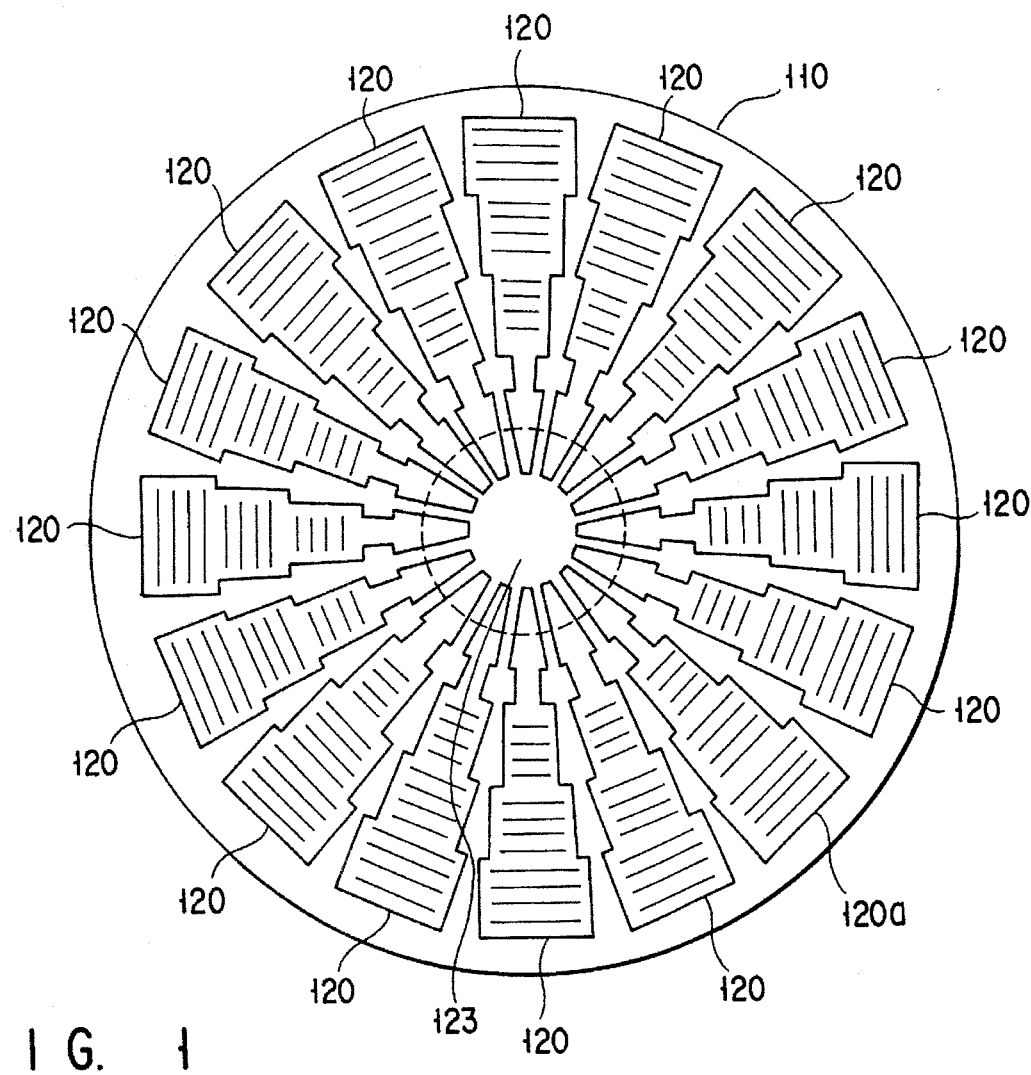
FIG. 1 is a plan view showing an arrangement of segments in a pellet substrate of an IGBT, for describing a conventional power semiconductor device.
Figure 2:
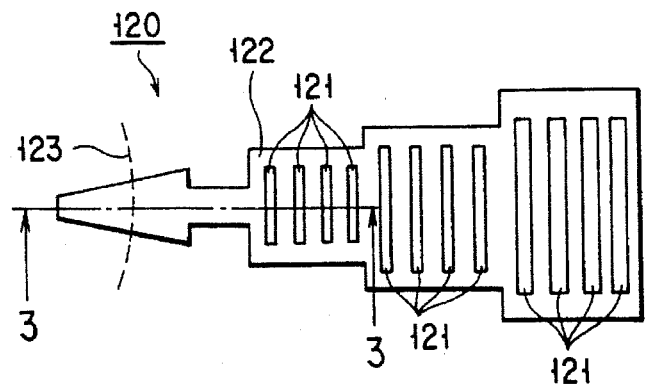
FIG. 2 is an enlarged pattern plan view of a polysilicon gate electrode of the segment shown in FIG. 1.
Figure 3:
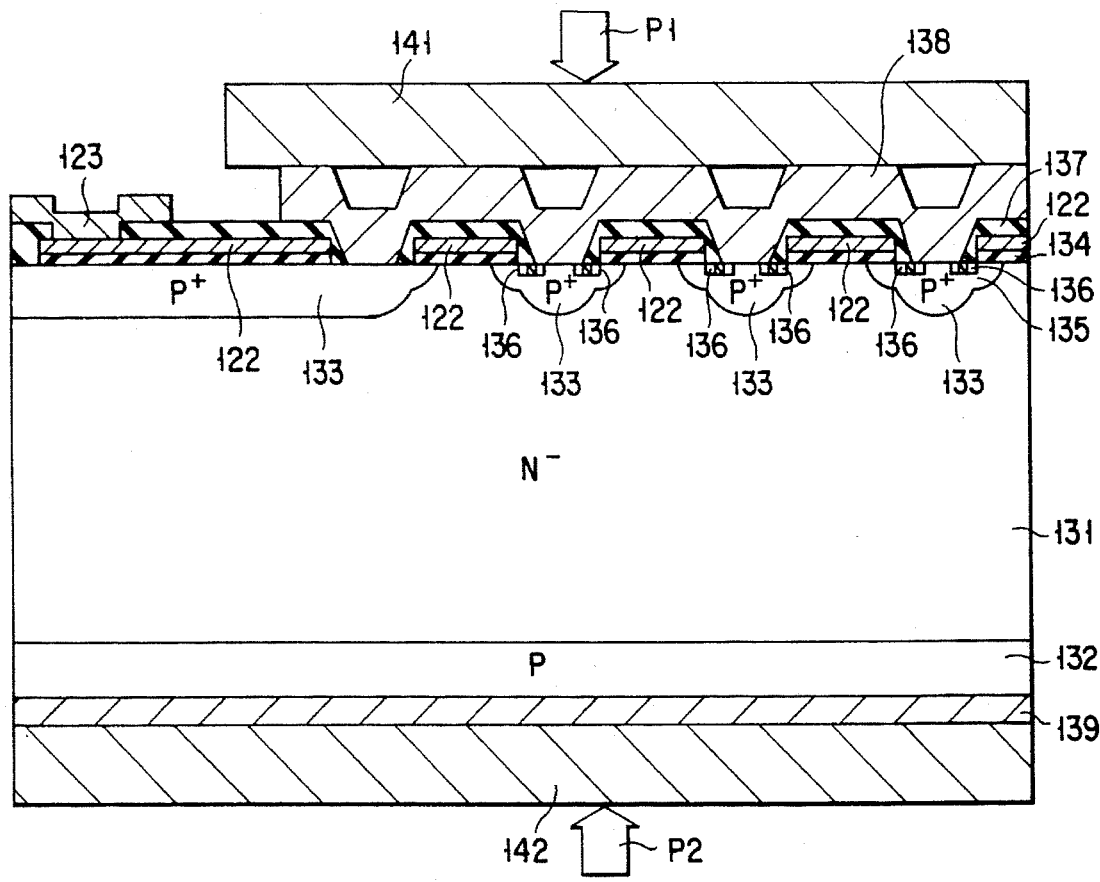
FIG. 3 is a cross-sectional view, taken along line 3—3 in FIG. 2, for showing a cross-sectional structure in which a pellet substrate is clamped between an emitter pressure-contact plate and a collector pressure-contact plate.
Figure 4:
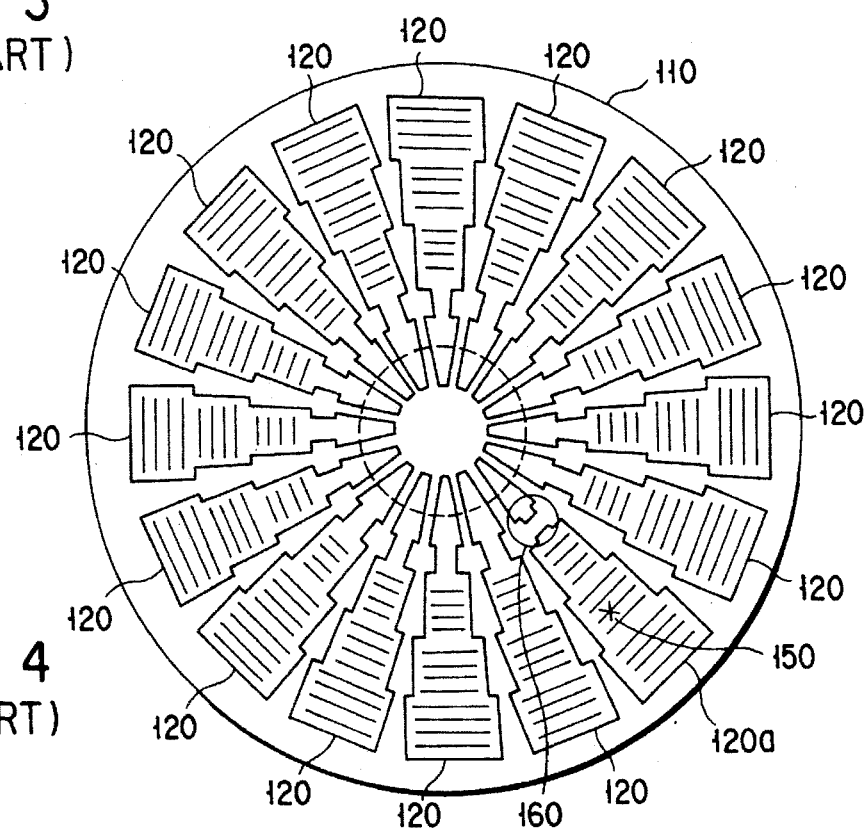
FIG. 4 is a plan view for describing a method of repairing a defect in the conventional IGBT shown in FIGS. 1 to 3.
Figure 5:
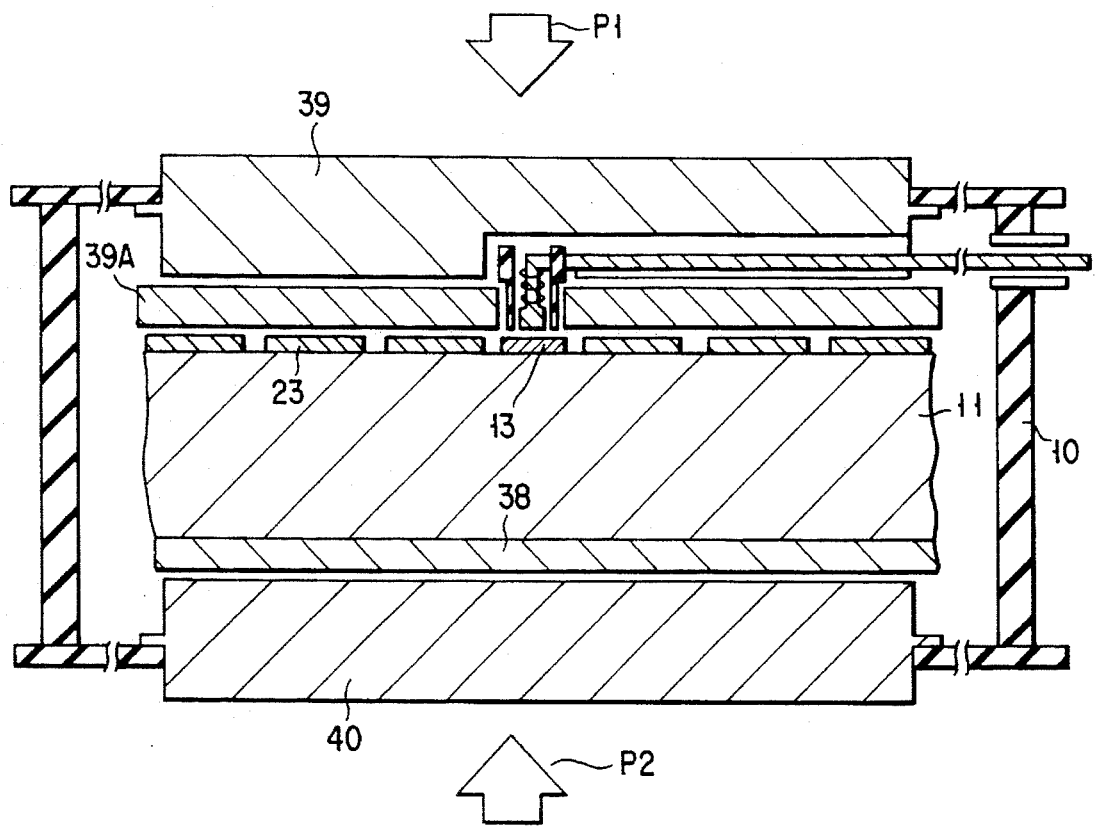
FIG. 5 is a cross-sectional view showing a schematic structure of a pressure-contact type IGBT, for describing a power semiconductor device according to a first embodiment of the invention.
Figure 6:
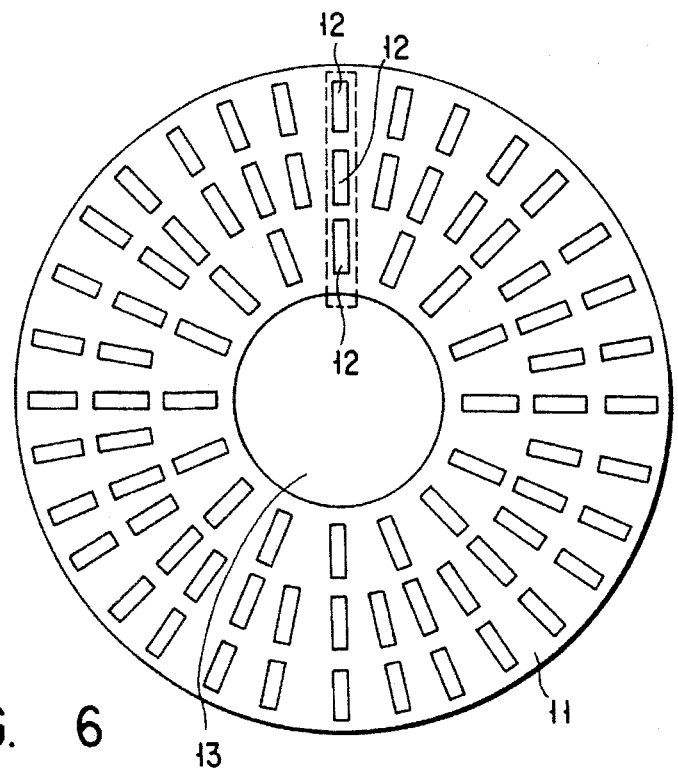
FIG. 6 is a plan view showing an arrangement of segments in the pellet substrate of the pressure-contact type IGBT shown in FIG. 5.
Figure 7:
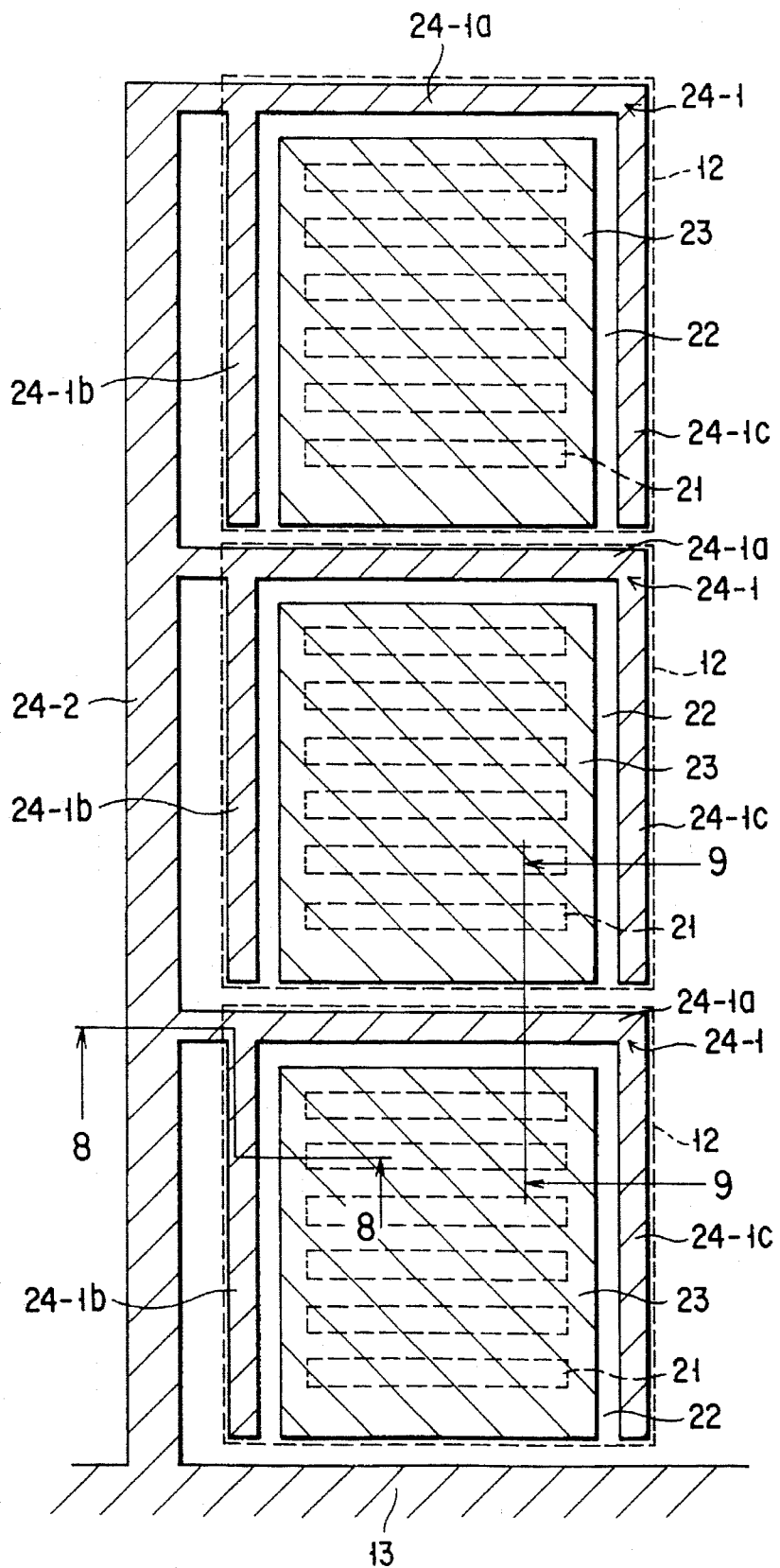
FIG. 7 is an enlarged pattern plan view of a region indicated by a broken line in FIG. 6.
Figure 8:
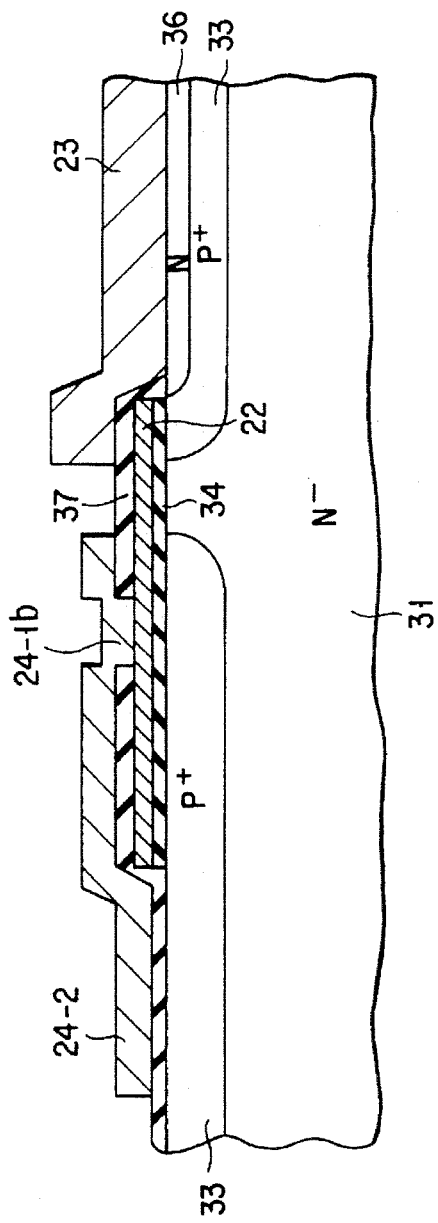
FIG. 8 is a cross-sectional view, taken along line 8—8 in FIG. 7, showing a surface portion of the pellet substrate.
Figure 9:
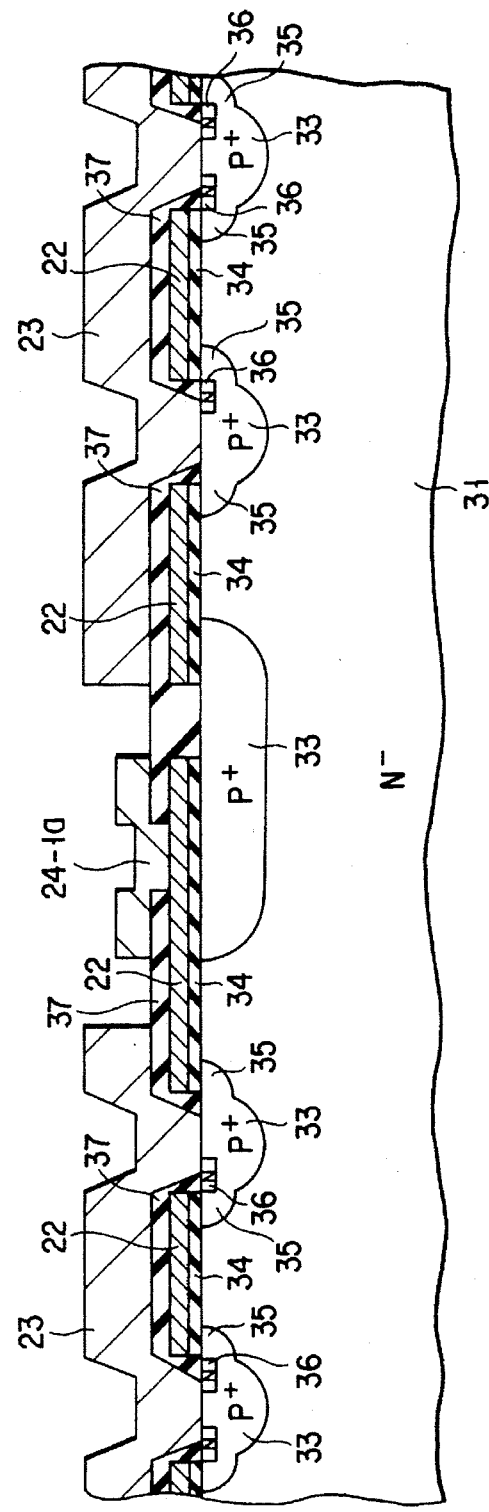
FIG. 9 is a cross-sectional view, taken along line 9—9 in FIG. 7, showing a surface portion of the pellet substrate.
Figure 10:
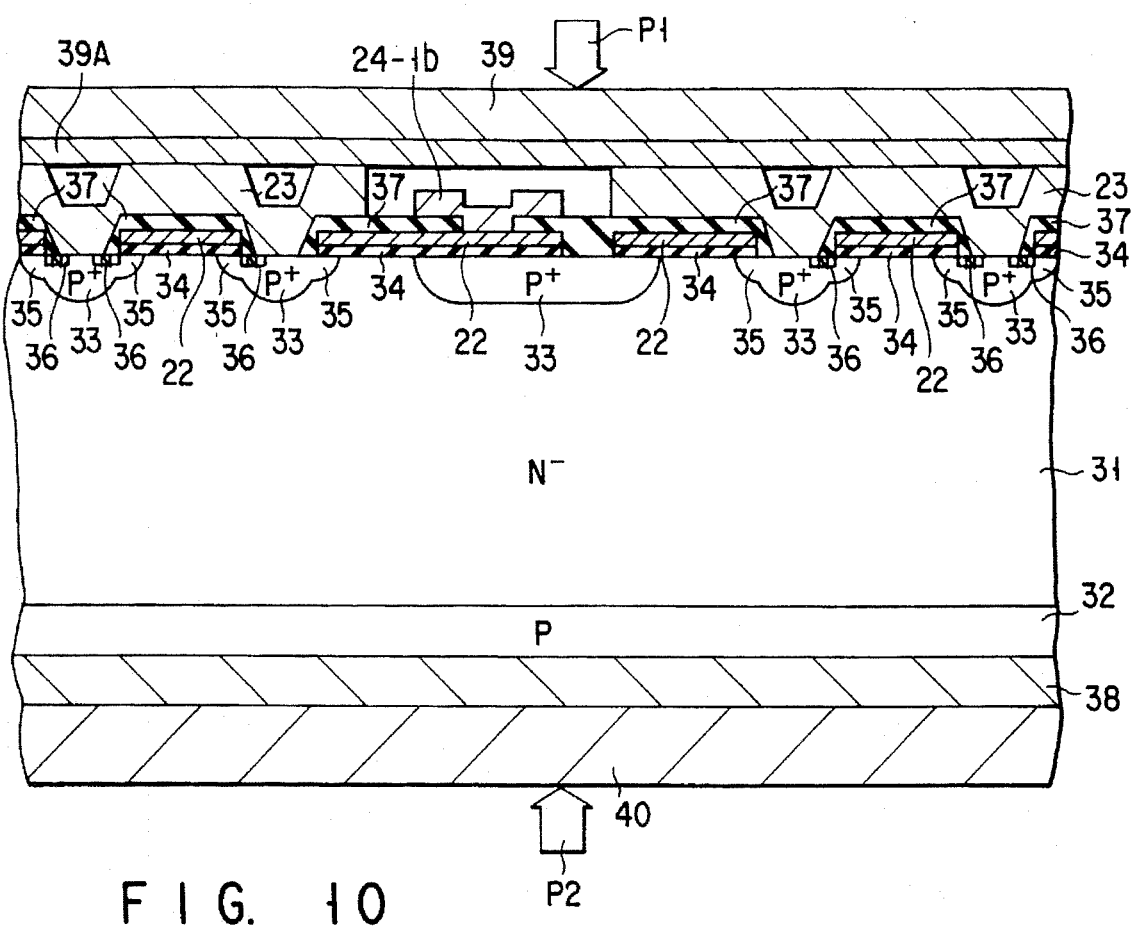
FIG. 10 is a cross-sectional view, taken along line 9—9 in FIG. 7, showing the structure of FIG. 9 in greater detail, in which the substrate is clamped between an emitter pressure-contact plate and a collector pressure-contact plate.

FIG. 5 is a cross-sectional view showing a schematic structure of the pressure-contact type IGBT. FIG. 6 is a plan view showing an arrangement of segments in the pellet substrate. FIG. 7 is an enlarged pattern plan view of a region indicated by a broken line in FIG. 6. FIG. 8 is a cross-sectional view, taken along line 8—8 in FIG. 7, showing a surface portion of the pellet substrate. FIG. 9 is a cross-sectional view, taken along line 9—9 in FIG. 7, showing a surface portion of the pellet substrate. FIG. 10 is a cross-sectional view, taken along line 9—9 in FIG. 7, showing the structure of FIG. 9 in greater detail, in which the substrate is clamped between an emitter pressure-contact plate and a collector pressure-contact plate.

As is shown in FIG. 5, a pellet substrate 11 of the IGBT is contained in an insulating package 10. A gate electrode terminal lead-out portion 13 is formed on a central portion of the surface of the pellet substrate 11, and emitter electrode layer 23 are formed on a peripheral portion of the surface of the pellet substrate 11. A collector electrode layer 38 is formed on a bottom surface of the pellet substrate 11. The pellet substrate 11 is clamped between an emitter pressure-contact plate 39 and a collector pressure-contact plate 40, and pressures are applied to the substrate 11, as indicated by arrows P1 and P2. A heat buffer plate 39A for dissipating heat of the pellet substrate 11, when such heat is produced, is interposed between the emitter pressure-contact plate 39 and the pellet substrate 11.

FIG. 6 shows an arrangement of segments in the pellet substrate 11. Rectangular segments 12 are arranged, for example, concentrically in three rows. The gate electrode terminal lead-out portion 13 is located at a central portion of the pellet substrate 11. Two or three segments 12 arranged radially from the center to the periphery of the substrate 11 constitute one unit. Polysilicon gate electrode layers of the segments 12 of each unit are electrically connected to the gate electrode terminal lead-out portion 13 via metal gate electrode layers.

FIG. 7 is an enlarged pattern plan view showing in detail one unit or a region indicated by a broken line in FIG. 6. FIG. 7 illustrates the connection between the segments 12 and gate electrode terminal lead-out portion 13.

Each segment 12 is constituted by a plurality of IGBT cells. Each segment 12 comprises a polysilicon gate electrode layer 22 having a plurality of openings 21, and an emitter electrode layer 23 provided on the polysilicon gate electrode layer 22 with an oxide film (not shown) interposed. Each polysilicon gate electrode layer 22 is connected to the emitter electrode terminal lead-out portion 13 via the metal gate electrode layers (segment metal gate electrode layer 24-1 and coupling metal gate electrode lead-out layer 24-2). These metal gate electrode layers 24-1 and 24-2 are formed by patterning a single Al layer. The metal gate electrode layers 24-2, which are trunk wiring portions, are formed radially from the gate electrode terminal lead-out portion 13 provided at the central portion of the pellet substrate 11 to the respective segments 12. Each of the metal gate electrode layers 24-1, which are branch wiring portions, is patterned to have a first portion 24-1a extending in a circumferential direction from the metal gate electrode layer 24-2, and second and third portions 24-1b and 24-1c extending from the first portion 24-1a towards the gate electrode terminal lead-out portion 13. Thus, the metal gate electrode layer 24-1 is situated to surround the three sides of the emitter electrode layer 23 and is electrically connected to the three sides of the polysilicon gate electrode layer 22.

As has been described above, in the present embodiment, the polysilicon gate electrode layer 22 is formed on the segment alone, and the metal gate electrode layers 24-1 and 24-2 are used as wiring layers between the segment and the gate electrode terminal lead-out portion 13. In this case, two or three segments (alternatively, one or four or more segments) constitutes one unit, and each unit is connected to the gate electrode terminal lead-out portion 13 via the metal gate electrode layers 24-1 (branch wiring portions) and the metal gate electrode layer 24-2 (trunk wiring portion).

FIGS. 8 and 9 show in detail the connection between the polysilicon gate electrode layer 22 and the metal gate electrode layer 24-1. FIG. 8 is a cross-sectional view taken along line 8—8 in FIG. 7, and FIG. 9 is a cross-sectional view taken along line 9—9 in FIG. 7. Both FIGS. 8 and 9 show major surface portions of the pellet substrate 11.

As is shown in FIG. 8, a $P^+$ region 33 is provided on a major surface of an $N^-$ type semiconductor substrate 31. An N emitter region 36 is provided in the $P^+$ region 33. A gate oxide film 34 and a polysilicon electrode layer 22 are provided on the substrate 31 within the segment area. An emitter electrode layer 23 is formed on, and electrically connected to, the N emitter region 36. An oxide film 37 is formed on the polysilicon gate electrode layer 22 and on a part of the $P^+$ region 33. An opening is formed in the oxide film 37 on the polysilicon gate electrode layer 22. Metal gate electrode layers 24-1 (24-1b) and 24-2 are provided on the oxide film 37 and are electrically connected to the polysilicon gate electrode layer 22.

In addition, as is shown in FIG. 9, the polysilicon gate electrode layer 22 is provided in the segment region. The oxide film 37 is provided on the polysilicon gate electrode layer 22. The emitter electrode layer 23, N emitter region 36 and $P^+$ region 33 are electrically connected via an opening formed selectively in the oxide film 37. Furthermore, the metal gate electrode layer 24-1 (24-1a) is electrically connected to the polysilicon gate electrode layer 22 via an opening formed in the oxide film 37 at the metal gate electrode layer 24-1.

Referring now to FIG. 10, the cross-sectional structure of the IGBT and the method of producing the IGBT will be described. FIG. 10 is a cross-sectional view showing the same part of the pellet substrate as shown in FIG. 9. In FIG. 10, however, the pellet substrate is clamped between the emitter pressure-contact plate and collector pressure-contact plate.

Impurity ions are injected in a bottom surface portion of an $N^-$ type semiconductor substrate 31, thereby forming a bottom-side P-emitter layer 32. Impurity ions are selectively injected in a major surface of the substrate 31, thereby forming a $P^+$ region 33. The major surface of the $N^-$ type semiconductor substrate 31 is thermally oxidized and an oxide film is formed. After a polysilicon layer is formed on the oxide film, the polysilicon layer is patterned and a gate oxide film 34 and a polysilicon gate electrode layer 22 are formed. In this case, the polysilicon electrode layer 22 is formed separately for each segment, and a plurality of openings 21 are selectively formed on the $P^+$ region 33 (see FIG. 7). Impurity ions are injected in the substrate 31 through the openings 21, thereby forming a P base region 35. After a mask (not shown) is formed on a bottom area of the opening 21, impurity ions are injected in the P base region 35 and an N emitter region 36 is formed. After an oxide film 37 is formed on the resultant structure, portions of the oxide film 37 between the gate electrode layers 22 are selectively removed, thereby removing part of the N emitter region 36 and P base region 35 ($P^+$ region 33) between the N emitter regions 36. An emitter electrode layer 23 is formed on the oxide film 37 and electrically connected to the N emitter region 36 and P+ region 33. After the oxide film 37 on the polysilicon gate electrode layer 22 is selectively etched away, a segment metal gate electrode layer 24-1 (24-1b) is formed and electrically connected to the polysilicon gate electrode layer 22. Furthermore, a collector electrode layer 38 is formed on the bottom-side P emitter layer 32 provided on the bottom surface of the substrate 31.

Thereafter, the characteristics of the IGBT are checked. If a segment with defective characteristics is found, the segment is separated from normal segments so that the defective segment may not function. If there is no defective segment after the repair of the defective segment, an annular heat buffer plate 39A and an annular emitter pressure-contact plate 39 are provided on the emitter electrode layer 23 and a collector pressure-contact plate 40 is provided on the collector electrode layer 38. The pellet substrate 11 is clamped between the pressure-contact plates 39 and 40 under pressures in directions P1 and P2.

A method of checking the characteristics of the IGBT will now be described in detail. At first, the characteristics are checked for each unit. Specifically, one unit is constituted by a plurality of segments (three segments in FIG. 7) coupled by the trunk wiring portion (metal gate electrode layer) extended radially from the central portion of the pellet substrate 11, and the characteristics are checked for each unit. If there is a malfunctioning unit, the respective segments of this unit are checked. Thereby, a defective segment can be identified easily and exactly. Of course, an operational check for each unit may be omitted, and the operational characteristics of each segment 12 may be checked.

Figure 11:
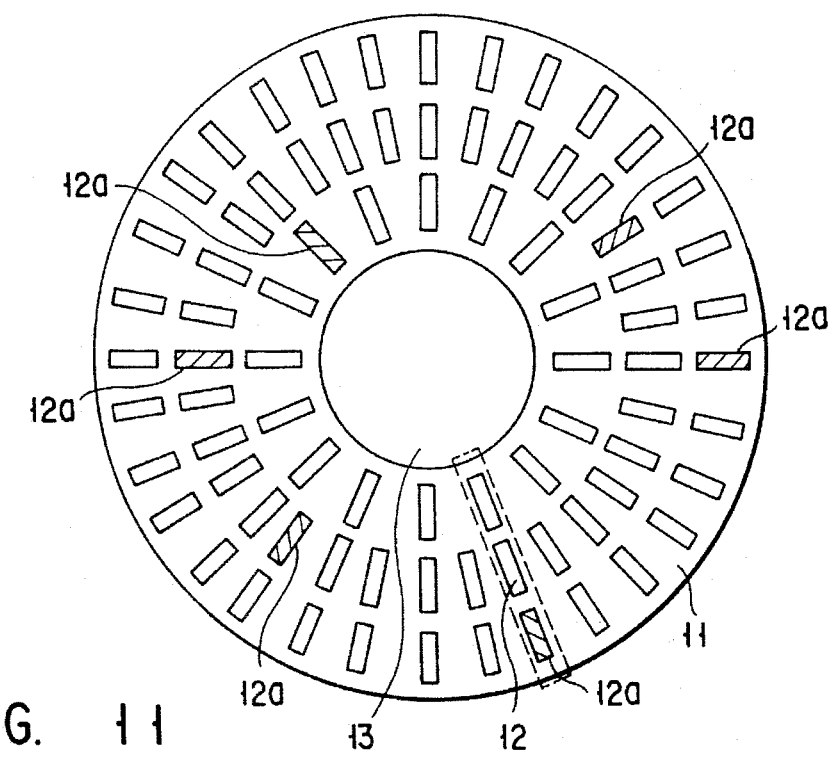
FIG. 11 is a plan view showing defective segments in the pellet.
Figure 12:
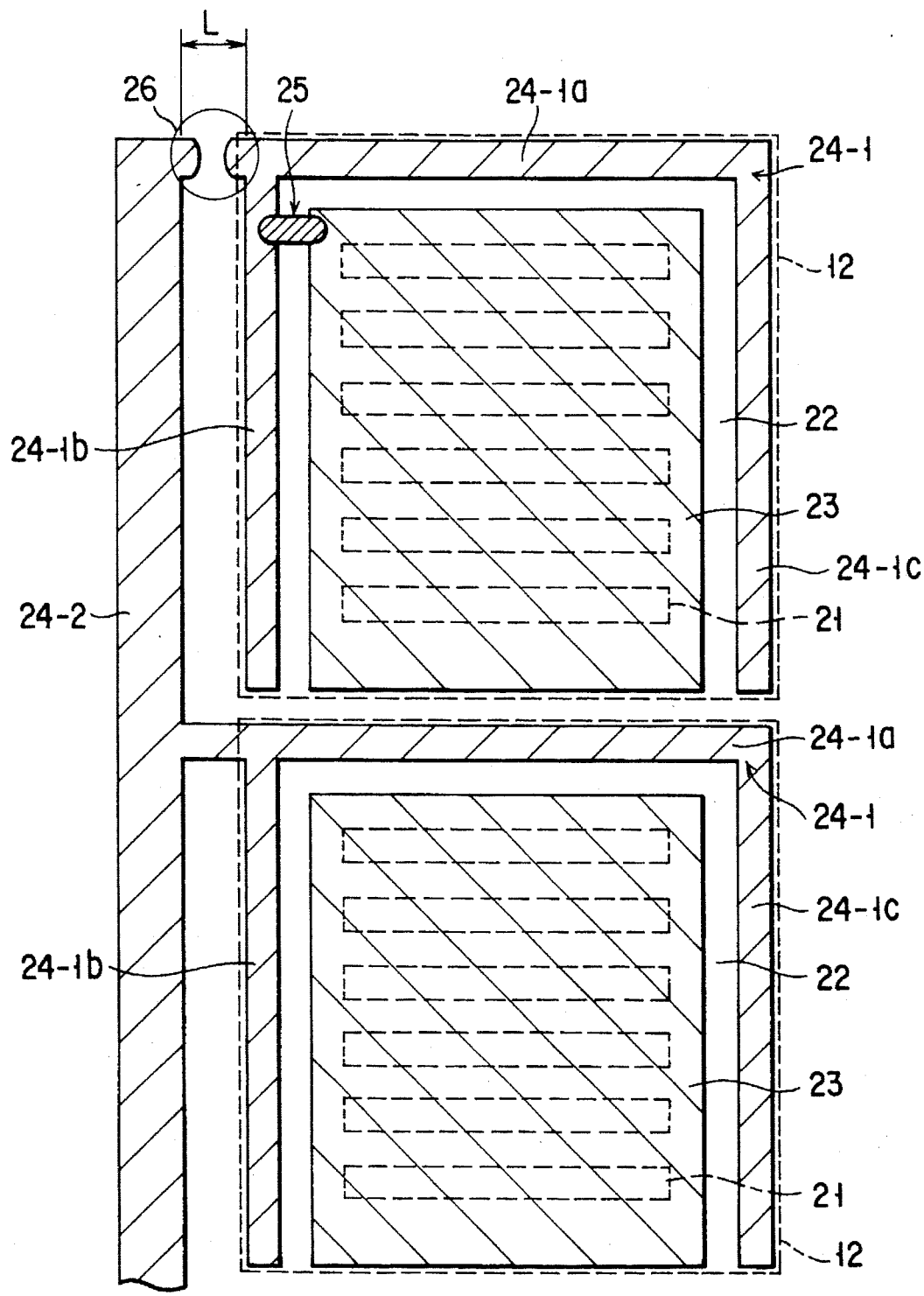
FIG. 12 is an enlarged pattern plan view of a region indicated by a broken line in FIG. 11.

Suppose that a plurality of defective segments 12a were found in the pellet substrate 11 by the check of characteristics, as shown in FIG. 11. In this case, each defective segment 12a is repaired by cutting off a connection portion (an encircled portion 26) between the segment metal gate electrode layer 24-1 and coupling metal gate electrode layer 24-2 by dropping an etching liquid onto the connection portion ("wet etching"), as shown in FIG. 12. Thus, the defective segment 12a is separated from the gate electrode terminal lead-out portion 13. Furthermore, the segment metal gate electrode layer 24-1b and emitter electrode layer 23 are connected by a conductor member 25 such as silver paste, thereby short-circuiting the gate and emitter and rendering the defective segment 12a non-operable. The location for short-circuiting the gate and emitter is not limited to the portion 24-1b, shown in FIG. 12, but it may be any location at which the emitter electrode layer 23 can be connected to the segment metal gate electrode layer 24-1a, 24-1b, 24-1c. The other defective segments 12a may also be repaired by cutting off them from the metal gate electrode layer 24-2 and short-circuiting the gate and emitter in a similar manner.

If the distance L between the metal gate electrode layers 24-1 and 24-2 is set at about 10 μm, the wet etching by means of dropping of etching liquid can be easily performed. It is desirable that the distance L be increased, unless the integration density of segments in the pellet substrate 11 is degraded.

According to the IGBT with the above structure, defective segments can be repaired in a smaller unit than in the prior art. Therefore, the non-effective area within the pellet substrate can be limited to a minimum. Accordingly, a decrease in current drive performance after repair can be prevented. A sufficiently high current drive performance can be obtained without increasing the pellet area in consideration of a decrease in current drive performance due to defective segments. In addition, even if defective segments 12a are present in a discrete fashion, they can be repaired and a decrease in current drive performance is small.

The polysilicon gate electrode layer 22 is formed in the segment 12 in such a size that the layer 22 surrounds the emitter electrode layer 23. The polysilicon gate electrode layer 22 and metal gate electrode layer 24-1 are connected at a peripheral portion of the emitter electrode layer 23. As a result, a gate bias applied to the respective segments at the time of turn-on is made uniform, and a variance in turn-on timing of segments 12 can be decreased. In addition, since the metal gate electrode layer 24-1 surrounds the upper, right and left sides of the segment 12 and does not surround the lower side thereof, the pitch between the segments in the radial direction of the substrate can be reduced and the integration density can be increased. Furthermore, since the gate electrode terminal lead-out portion 13 is connected to each segment 12 by means of the metal gate electrode layers 24-2 and 24-1, a variance in gate bias applied to the respective segments 12 within the pellet substrate 11 can be decreased. As a result, concentration of current at turn-on/turn-off time is curbed and stable device characteristics can be obtained.

In the above embodiment, the metal gate electrode layers 24-1 and 24-2 are made of Al. However, the metal gate electrode layers 24-1 and 24-2 may have a two-layer structure of an Al layer and a refractory metal layer. In this case, when the metal gate electrode layer 24-1 is cut off, an etching liquid most suitable for the material of the metal gate electrode layer 24-1 is used, and the Al layer and refractory metal layer are etched in separate steps.

As has been described above, in the pressure-contact type IGBT of the present invention, a plurality of segments constitutes one unit and the polysilicon gate electrode layer 22 of each segment 12 is connected to the gate electrode terminal lead-out portion 13 by using single metal gate electrode layer 24-2 provided for each unit. The segments 12 are properly arranged within the pellet substrate 11 by adjusting the size of the unit. Even if there is a defective segment, the defective segment alone is cut off at the connection portion between the trunk wiring portion 24-2 and branch wiring portion 24-1. The non-effective area of the pellet substrate can be reduced to a minimum. Thus, a sufficiently high current drive performance can be obtained without increasing the pellet area in consideration of a decrease in current drive performance due to defective segments. The repair of the pellet is performed easily. Furthermore, the turn-on/off current is made uniform.

Figure 13:
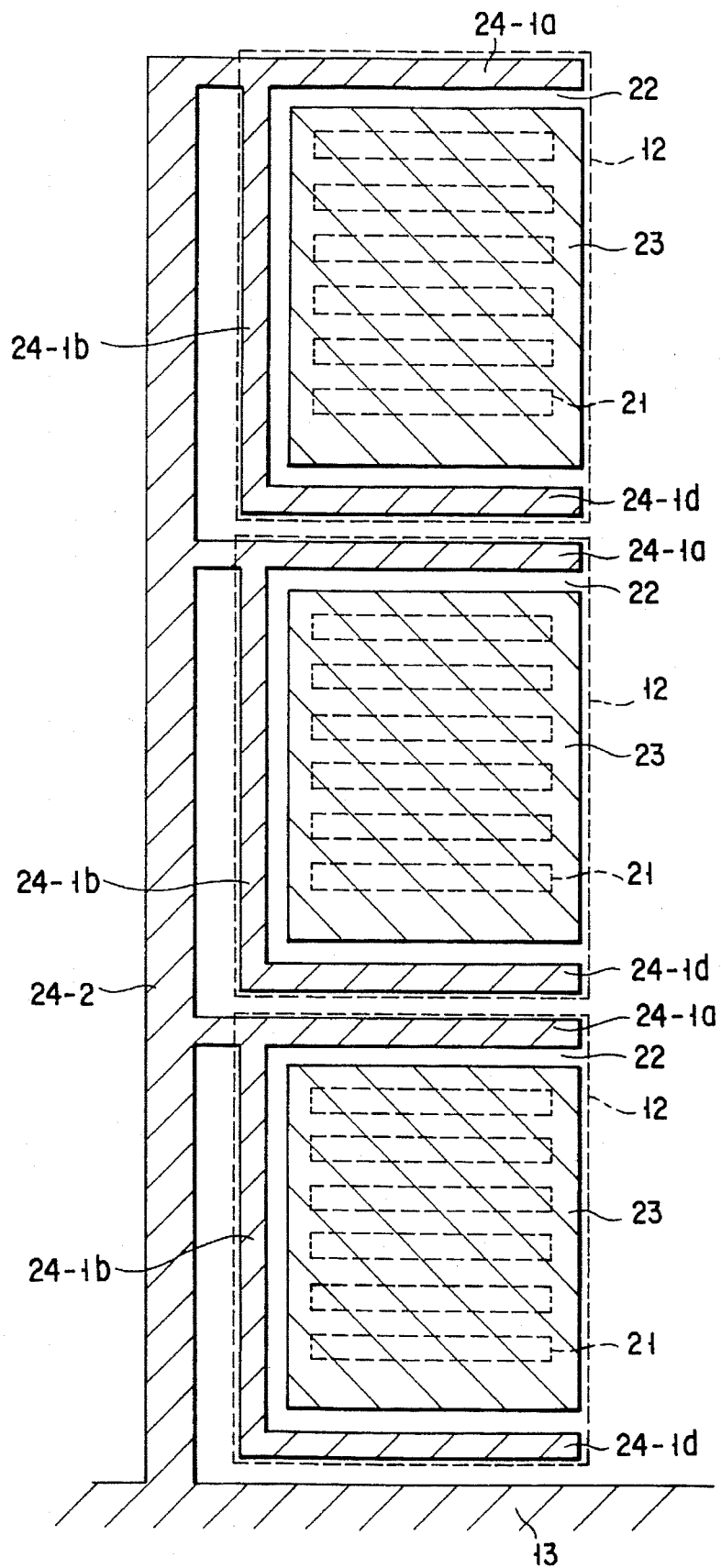
FIG. 13 is an enlarged pattern plan view showing another example of the structure indicated by the broken line in FIG. 6.

FIG. 13 is an enlarged pattern plan view showing another example of structure of the region indicated by a broken line in FIG. 6. FIG. 13 differs from FIG. 7 with respect to the pattern of the segment metal gate electrode layer (branch wiring portion) 24-1. In FIG. 13, the segment metal gate electrode layer 24-1 is patterned to have a first portion 24-1a extending from the coupling metal gate electrode layer (trunk wiring portion) 24-2 in the circumferential direction of the pellet substrate 11, a second portion 24-1b extending from the first portion 24-1a towards the gate electrode terminal lead-out portion 13, and a third portion 24-1c extending from the second portion 24-1b in the circumferential direction of the pellet substrate 11.

With this pattern, like the pattern shown in FIG. 7, a defective segment can be cut off from the coupling metal gate electrode layer 24-2 by dropping an etching liquid to the connection portion between the metal gate electrode layer 24-2 and metal gate electrode layer 24-1. In addition, the metal gate electrode layer 24-1 is connected to the emitter electrode layer 23 by means of a conductive member of silver paste, etc., thereby short-circuiting the gate and emitter and rendering the defective segment non-operable. Since the metal gate electrode layer 24-1 surrounds the upper, left and lower sides of the segment 12 and does not surround the right side thereof, the pitch of the segments in the circumferential direction of the substrate can be reduced and the integration density can be increased.

Of course, the same effect can be obtained with the pattern in which the metal gate electrode layer 24-1 surrounds the upper, right and lower sides of the segment 12 and does not surround the left side thereof.

The above-described first embodiment is directed to the pressure-contact type IGBT as power semiconductor device. The first embodiment, however, is also applicable to a MOS controlled thyristor (MCT), a MOS advanced gate turn-off thyristor (MAGT), a power MOSFET, etc.

Figure 14:
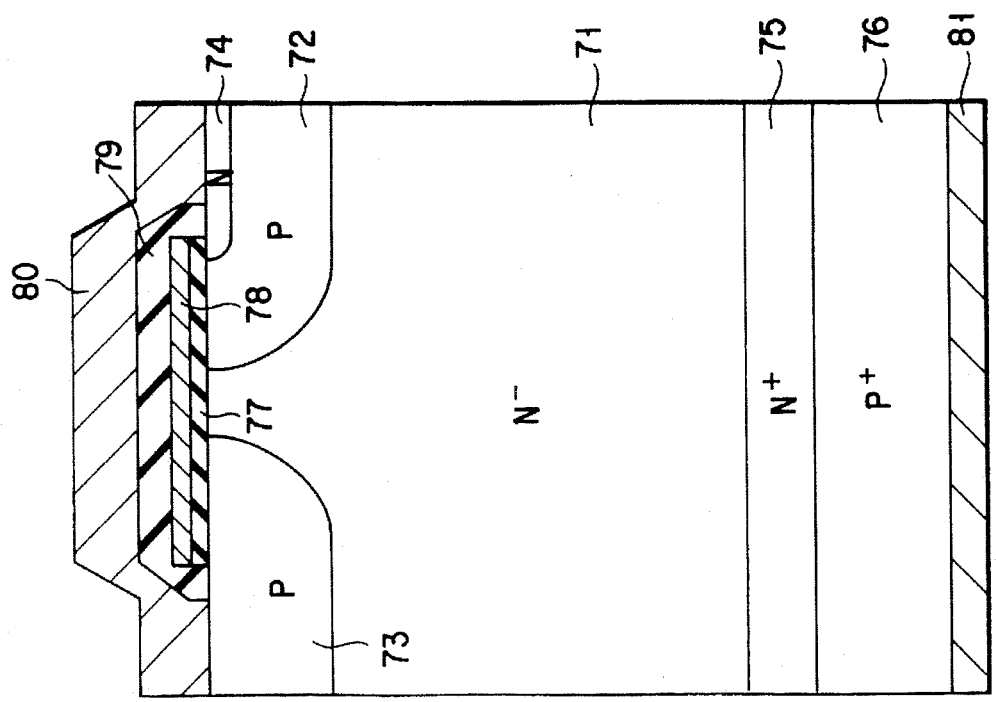
FIG. 14 is a cross-sectional view showing an MCT cell of a power semiconductor device according to a second embodiment of the invention.

FIG. 14 shows a structure of an MCT cell, which is formed in the following manner. An $N^+$ buffer layer 75 and a $P^+$ emitter layer 76 are successively formed on a bottom surface of the $N^-$ type semiconductor substrate 71. Impurities are diffused in a major surface portion of an $N^-$ type semiconductor substrate 71, thereby forming a P base region 72 and a P source region 73. Impurity ions are selectively injected in the P base region 72, thereby forming an N emitter region 74. Then, the major surface of the substrate 71 is oxidized and an oxide film is formed thereon. A polysilicon layer is formed on the oxide film. The polysilicon layer and oxide film are patterned, and a gate oxide film 77 is formed on the P base region 72 and P source region 73. A polysilicon gate electrode layer 78 is formed on the gate oxide film 77. An oxide film 79 is formed on the resultant structure. Openings are formed on a part of the P source region 73 and on the N emitter region. Thereafter, a cathode electrode layer 80 is formed on the oxide film 79, thereby electrically connecting the P source region 73 and N emitter region 74. Furthermore, an anode electrode layer 81 is formed on the $P^+$ emitter layer 76.

A segment including two or more MCT cells each having the above structure is formed, and one unit is constituted by two or more segments. The units of segments are arranged within the pellet substrate 11, as shown in FIGS. 6 and 7. In this case, a polysilicon gate electrode layer is formed as a gate electrode layer within each segment. The polysilicon gate electrode layers are connected to the single unit, and metal gate electrode layers 24-1 and 24-2 made of, e.g. Al are formed as lead-out electrodes to the gate electrode terminal lead-out portion 13. Thus, the same advantages as with the IGBT can be obtained.

In the MCT cell shown in FIG. 14, the $N^+$ buffer layer 75 functions to curb the injection of holes from the $P^+$ emitter layer 76 into the $N^-$ type semiconductor substrate 71 so that the MCT cell can be easily turned on. Thus, there is no problem with the operation of the MCT cell even without the $N^+$ buffer layer 75.

Figure 15:
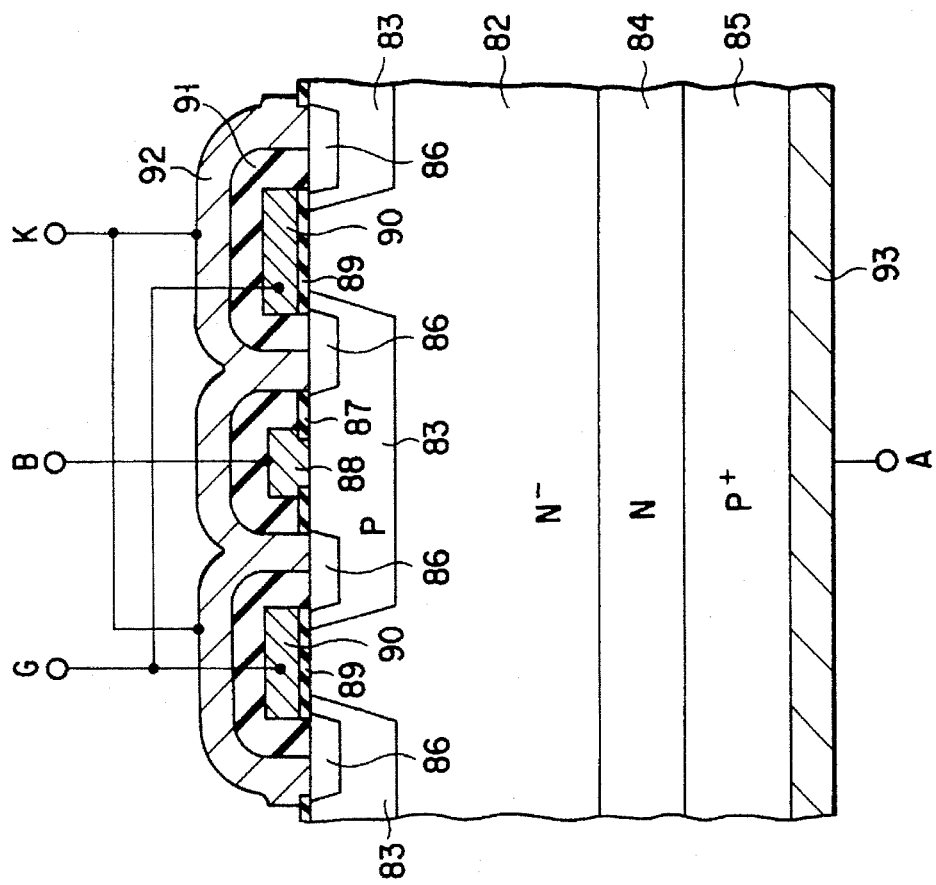
FIG. 15 is a cross-sectional view showing an MAGT cell of a power semiconductor device according to a fourth embodiment of the invention.

FIG. 15 is a cross-sectional view for describing a power semiconductor device according to a third embodiment of the invention. Specifically, FIG. 15 shows a MOS advanced gate turn off thyristor (MAGT) cell which is a bipolar MOS composite device like the IGBT. A plurality of P type base regions 83 are discretely provided in a major surface portion of an $N^-$ type base region 82. An N type buffer layer 84 and a $P^+$ type emitter region 85 are provided on a bottom surface of the base region 82. $N^+$ type emitter regions 86 are formed in surface portions of the P type base regions 83. An oxide film 87 is formed on the P type base region 83 between the $N^+$ type emitter regions 86, and a base electrode layer 88 is formed on the oxide film 87. The base electrode layer 88 is electrically connected to the P type base region 83 via an opening formed in the oxide film 87. A gate oxide film 89 is provided on the P type base region 83, $N^-$ type base region 82 and P type base region 83 between the $N^+$ type emitter regions 86. A gate electrode layer 90 is formed on the gate oxide film 89. The P type base regions 83 below the gate electrode layer 90 function as channel regions. An interlayer insulating film 91 is formed on the base electrode 88 and gate electrode layers 90. A cathode layer 92 is formed on the interlevel insulating film 91. The cathode layer 92 is electrically connected to the $N^+$ type emitter regions 86 via openings formed in the inter-level insulating film 91 on each $N^+$ type emitter region 86. On the other hand, an anode layer 93 is formed on the $P^+$ type emitter region 85.

A segment including two or more MAGT cells each having the above structure is formed, and one unit is constituted by two or more segments. The units of segments are arranged within the pellet substrate 11, as shown in FIGS. 6 and 7. In this case, a polysilicon gate electrode layer is formed as a gate electrode layer within each segment. The polysilicon gate electrode layers are connected to the single unit, and metal gate electrode layers 24-1 and 24-2 made of, e.g. Al are formed as lead-out electrodes to the gate electrode terminal lead-out portion 13. Thus, the same advantages as with the IGBT or MCT can be obtained.

In the MAGT cell shown in FIG. 15, the N type buffer layer 84 functions to curb the injection of holes from the $P^+$ emitter layer 85 into the $N^-$ type base region 82 so that the MAGT cell can be easily turned on. Thus, there is no problem even without the N type buffer layer 84.

Figure 16:
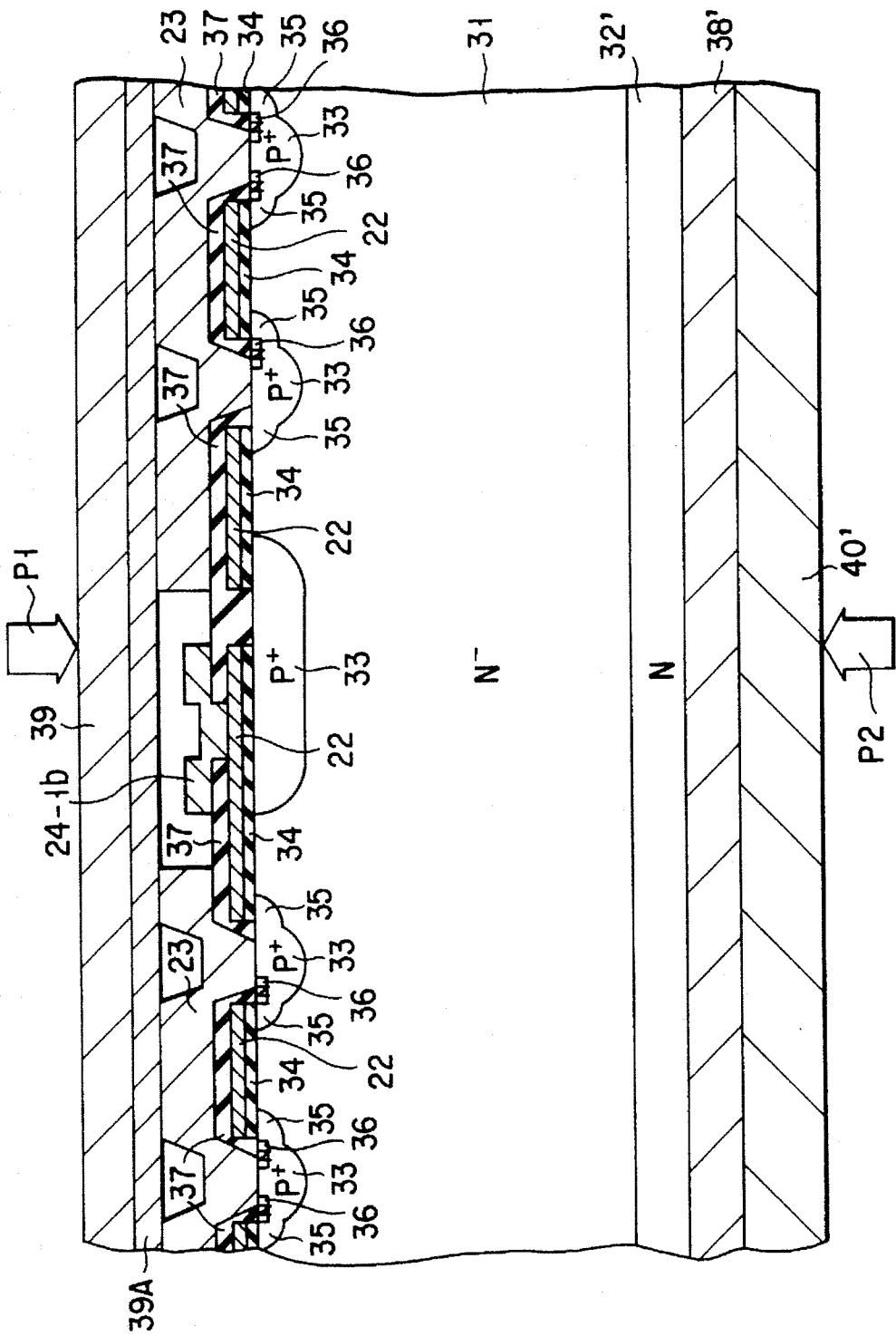
FIG. 16 is a cross-sectional view showing a power MOSFET cell of a power semiconductor device according to a fourth embodiment of the invention.

FIG. 16 is a cross-sectional view showing a power MOSFET cell of a power semiconductor device according to a fourth embodiment of the invention. The basic device structure of the power MOSFET cell is the same as that of the IGBT cell, except that an N type source region 32' is substituted for the bottom-side emitter layer 32 of the IGBT, a drain electrode layer 38' is substituted for the collector electrode layer 38, and a drain pressure-contact plate 40' is substituted for the collector pressure-contact plate 40.

In the power MOSFET, like the IGBT, MCT and MAGT, a segment including two or more MOSFET cells each having the above structure is formed, and one unit is constituted by two or more segments. The units of segments are arranged within the pellet substrate 11, as shown in FIGS. 6 and 7. In this case, a polysilicon gate electrode layer is formed as a gate electrode layer within each segment. The polysilicon gate electrode layers are connected to the single unit, and metal gate electrode layers 24-1 and 24-2 made of, e.g. Al are formed as lead-out electrodes to the gate electrode terminal lead-out portion 13. Thus, the same advantages as with the IGBT, MCT and MAGT can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a pellet substrate;

a plurality of segments each constituted by at least one
        MOS composite type semiconductor cell, said segments being arranged concentrically in a plurality of rows in the pellet substrate, each of said segments having an independent polysilicon gate electrode layer;

a gate electrode terminal lead-out portion provided at a central portion of the pellet substrate;

a metal gate electrode layer for electrically connecting to said polysilicon gate electrode layer of at least one of said segments of a unit, said unit having at least one of said segments arranged radially from the central portion of the pellet substrate towards a peripheral portion of the pellet substrate, said metal gate electrode layer including a trunk wiring portion extending radially from said gate electrode terminal lead-out portion and a branch wiring portion extending from the trunk wiring portion in a circumferential direction of the pellet substrate and being electrically connected to said polysilicon gate electrode layer of each of said segments, wherein said polysilicon gate electrode layer is rectangular, and said branch wiring portion is connected to said polysilicon gate electrode layer along three peripheral sides of the polysilicon gate electrode layer; and a pressure-contact plate for exerting a clamping force on said pellet substrate.

2. The semiconductor device according to claim 1, wherein said MOS composite type semiconductor cell is one of an insulated gate bipolar transistor cell, a MOS controlled thyristor cell, a MOS advanced gate turn off thyristor cell and a power MOSFET cell.

3. The semiconductor device according to claim 1, wherein said metal gate electrode layer includes an Al layer.

4. The semiconductor device according to claim 1, wherein said metal gate electrode layer includes an Al layer and a refractory metal layer laminated on said Al layer.

5. A semiconductor device comprising:

a pellet substrate;

a plurality of segments each constituted by at least one MOS composite type semiconductor cell, said segments being arranged concentrically in a plurality of rows in the pellet substrate, each of said segments having an independent polysilicon gate electrode layer;

a gate electrode terminal lead-out portion provided at a central portion of the pellet substrate;

a metal gate electrode layer for electrically connecting to said polysilicon gate electrode layer of at least one of said segments of a unit, said unit having least one of said segments arranged radially from the central portion of the pellet substrate towards a peripheral portion of the pellet substrate, said metal gate electrode layer including a trunk wiring portion extending radially from said gate electrode terminal lead-out portion and a branch wiring portion extending from the trunk wiring portion in a circumferential direction of the pellet substrate and being electrically connected to said polysilicon gate electrode layer of each of said segments, wherein a defective segment of said plurality of segments is separated by cutting off said branch wiring portion from said trunk wiring portion;

a conductor member for connecting said cut-off branch wiring portion to an emitter electrode, thereby rendering said defective segment non-operable; and a pressure-contact plate for exerting a clamping force on said pellet substrate.

6. The semiconductor device according to claim 5, wherein said branch wiring portion is cut off from the trunk wiring portion by dropping an etching liquid.

7. The semiconductor device according to claim 1, further comprising a heat buffer plate interposed between said pressure-contact plate and said pellet substrate.

8. A semiconductor device comprising:

a pellet substrate;

a plurality of segments each constituted by at least one MOS composite type semiconductor cell, said segments being arranged concentrically in a plurality of rows in the pellet substrate, each of said segments having an independent polysilicon gate electrode layer;

a gate electrode terminal lead-out portion provided at a central portion of the pellet substrate;

a metal gate electrode layer for electrically connecting to said polysilicon gate electrode layer of at least one of said segments of a unit, said unit having at least one of said segments arranged radially from the central portion of the pellet substrate towards a peripheral portion of the pellet substrate, said metal gate electrode layer including a trunk wiring portion extending radially from said gate electrode terminal lead-out portion and a branch wiring portion extending from the trunk wiring portion in a circumferential direction of the pellet substrate and being electrically connected to said polysilicon gate electrode layer of each of said segments, wherein said polysilicon gate electrode layer is rectangular, and said branch wiring portion is connected to said polysilicon gate electrode layer along three peripheral sides of the polysilicon gate electrode layer.

9. The semiconductor device according to claim 8, wherein said MOS composite type semiconductor cell is one of an insulated gate bipolar transistor cell, a MOS controlled thyristor cell, a MOS advanced gate turn off thyristor cell and a power MOSFET cell.

10. The semiconductor device according to claim 8, wherein said metal gate electrode layer includes an Al layer.

11. The semiconductor device according to claim 8, wherein said metal gate electrode layer includes an Al layer and a refractory metal layer laminated on said Al layer.

12. The semiconductor device according to claim 8, wherein a defective segment of said plurality of segments is separated by cutting off said branch wiring portion from said trunk wiring portion.

13. The semiconductor device according to claim 12, further comprising a conductor member for connecting said cut-off branch wiring portion to an emitter electrode, thereby rendering said defective segment non-operable.

14. The semiconductor device according to claim 12, wherein said branch wiring portion is cut off from the trunk wiring portion by dropping an etching liquid.

* * * * *